(12) United States Patent
Nakanishi

(10) Patent No.: US 8,237,447 B2
(45) Date of Patent: Aug. 7, 2012

(54) APPARATUS FOR DETECTING STATE OF STORAGE DEVICE

(75) Inventor: Toshiaki Nakanishi, Toyohashi (JP)

(73) Assignee: Panasonic EV Energy Co., Ltd., Kosai-shi (JP)

( * ) Notice: Subject to any disclaimer, the term of this patent is extended or adjusted under 35 U.S.C. 154(b) by 526 days.

(21) Appl. No.: 12/114,653

(22) Filed: May 2, 2008

(65) Prior Publication Data

US 2008/0282018 A1 Nov. 13, 2008

(30) Foreign Application Priority Data

May 11, 2007 (JP) ................................. 2007-126449
May 11, 2007 (JP) ................................. 2007-126450

(51) Int. Cl.
*G01N 27/416* (2006.01)

(52) U.S. Cl. ...................... 324/426; 324/433; 324/76.39; 324/76.48; 320/132; 320/152; 320/157; 320/158; 320/162; 320/163

(58) Field of Classification Search .................. 324/433, 324/76.39, 76.48; 320/132, 152, 157, 158, 320/162, 163
See application file for complete search history.

(56) References Cited

U.S. PATENT DOCUMENTS

| | | | | |
|---|---|---|---|---|
| 4,995,053 A | * | 2/1991 | Simpson et al. ............... | 375/130 |
| 5,068,582 A | * | 11/1991 | Scott ......................... | 318/400.35 |
| 5,598,086 A | | 1/1997 | Somerville | |
| 5,712,568 A | * | 1/1998 | Flohr et al. .................... | 324/434 |
| 5,764,063 A | * | 6/1998 | Katou et al. .................. | 324/434 |
| 5,804,944 A | * | 9/1998 | Alberkrack et al. .......... | 320/163 |
| 5,828,568 A | * | 10/1998 | Sunakawa et al. .............. | 700/79 |
| 6,104,166 A | * | 8/2000 | Kikuchi et al. ............... | 320/132 |
| 6,262,670 B1 | * | 7/2001 | Ballou .......................... | 340/664 |
| 6,265,877 B1 | * | 7/2001 | Kimura et al. ................ | 324/427 |
| 6,268,710 B1 | * | 7/2001 | Koga ............................ | 320/116 |
| 6,392,458 B1 | * | 5/2002 | Miller et al. .................. | 327/158 |

(Continued)

FOREIGN PATENT DOCUMENTS

JP 9-56083 A 2/1997

(Continued)

OTHER PUBLICATIONS

Notice of Grounds for Rejection (JP) mailed May 10, 2011, issued in corresponding Japanese Application No. 2007-126449, filed May 11, 2008, 4 pages.

*Primary Examiner* — Patrick Assouad
*Assistant Examiner* — Lamarr Brown
(74) *Attorney, Agent, or Firm* — Christensen O'Connor Johnson Kindness PLLC

(57) ABSTRACT

An apparatus for detecting the state of a storage device prevents occurrence of a leakage current. A low-level detection unit is provided for each of blocks of a battery pack. Control units are connected to the blocks of the battery pack by way of first switches and are started upon receipt of power supply. The control units and measurement units are connected to the blocks by way of second switches. The control units activate the second switches after being started as a result of activation of the first switches, to thus receive power supply, and commence measurement of block voltages by means of the measurement units. The high-level detection unit supplies a read signal and a synchronous signal to the low-level detection units by way of the first switches.

1 Claim, 5 Drawing Sheets

U.S. PATENT DOCUMENTS

| | | | |
|---|---|---|---|
| 6,501,250 B2* | 12/2002 | Bito et al. | 320/152 |
| 6,522,104 B1* | 2/2003 | Drori | 320/149 |
| 6,693,577 B2* | 2/2004 | Yamamoto | 341/155 |
| 7,109,684 B2* | 9/2006 | Takaoka et al. | 320/132 |
| 7,276,880 B2* | 10/2007 | Kneifel et al. | 320/132 |
| 7,439,706 B2* | 10/2008 | Brenner | 320/106 |
| 7,536,576 B2* | 5/2009 | Shima et al. | 713/340 |
| 7,573,238 B2* | 8/2009 | Kawai | 320/132 |
| 7,629,771 B2* | 12/2009 | Li et al. | 320/134 |
| 7,656,164 B2* | 2/2010 | Kawamura | 324/434 |
| 7,688,075 B2* | 3/2010 | Kelley et al. | 324/426 |
| 7,710,120 B2* | 5/2010 | Yudahira et al. | 324/433 |
| 7,830,119 B2* | 11/2010 | Naik | 320/132 |
| 8,102,179 B2* | 1/2012 | Mingant et al. | 324/426 |
| 8,111,071 B2* | 2/2012 | Lim et al. | 324/434 |
| 8,164,307 B2* | 4/2012 | Cargonja et al. | 320/132 |
| 2002/0003417 A1* | 1/2002 | Bito et al. | 320/152 |
| 2002/0180447 A1* | 12/2002 | Masse et al. | 324/433 |
| 2003/0001544 A1* | 1/2003 | Nakanishi | 320/162 |
| 2003/0189431 A1* | 10/2003 | Perkins et al. | 324/509 |
| 2004/0150595 A1* | 8/2004 | Kasai | 345/82 |
| 2007/0001697 A1* | 1/2007 | Dobberpuhl et al. | 324/763 |
| 2007/0145947 A1* | 6/2007 | Sakurai et al. | 320/132 |
| 2007/0250723 A1* | 10/2007 | Shima et al. | 713/300 |
| 2008/0077338 A1* | 3/2008 | Wong et al. | 702/63 |
| 2009/0174411 A1* | 7/2009 | Yudahira et al. | 324/433 |
| 2010/0026244 A1* | 2/2010 | Iida et al. | 320/134 |

FOREIGN PATENT DOCUMENTS

| | | |
|---|---|---|
| JP | 11-109005 A | 4/1999 |
| JP | 2005-261193 A | 9/2005 |
| JP | 2007071871 A * | 3/2007 |

* cited by examiner

APPARATUS FOR DETECTING STATE OF STORAGE DEVICE

PRIORITY INFORMATION

This application claims priority from Japanese Patent Applications No. 2007-126449 filed on May 11, 2007 and No. 2007-126450 filed on May 11, 2007, which are incorporated herein by reference in its entirety.

BACKGROUND OF THE INVENTION

1. Technical Field

The present invention relates to an apparatus for detecting the state of a storage device, and more particularly to an apparatus for detecting the voltage of a battery pack, and the like.

2. Related Art

A hybrid electric vehicle or a pure electric vehicle has hitherto been equipped with a battery pack built by means of series connection of a plurality of blocks, each of which is made up of one cell or a plurality of series-connected cells, and an apparatus for detecting a voltage of the battery pack, and the like, has heretofore been known.

11-109005 A describes a configuration that includes a differential amplifier for producing an output voltage corresponding to a voltage across a secondary battery serving as a battery to be measured, a voltage-frequency converter for converting the voltage output from the differential amplifier into a frequency, and a microcomputer serving as detection means for detecting the frequency as a voltage of the battery to be measured; and that detects the voltage of the secondary battery by mere connection of one signal line to the microcomputer by use of the voltage-frequency converter.

However, when a voltage of each of blocks of the battery pack is detected by connecting the block to a detector such as a voltage-frequency converter (a V/F converter), or the like, a leakage current arises when the battery is out of use. In order to prevent occurrence of the leakage current, disconnection of the battery from the detection circuit is required. Further, another method using a flying capacitor is also available as the method for detecting the voltage of a battery pack. Since a plurality of expensive low-resistance photo-MOS relays are required to prevent occurrence of a leakage current, an increase in cost and the number of components is also entailed, which in turn poses difficulty in miniaturization of the battery pack. Moreover, if voltages of respective blocks can be acquired synchronously or at arbitrary timings, an advantage will be yielded.

SUMMARY

The present invention provides a state detection apparatus that prevents, by means of a simple configuration, occurrence of a leakage current, which would otherwise be caused during a non-operating state. Further, the present invention provides a state detection apparatus which acquires a voltage of a storage device synchronously or at arbitrary timing.

The present invention is an apparatus for detecting state of a storage device, comprising:

a measurement unit for measuring a voltage of the storage device; and a control unit for controlling operation of the measurement unit, wherein the control unit operates by means of power from the storage device, and the control unit further comprises a first switch for switching a connected state/a disconnected state between the storage device and the control unit; and a second switch that is connected in parallel with the first switch and that switches a connected state/a disconnected state between the storage device and the measurement unit. According to the present invention, the storage device is disconnected from the measurement unit by switching the second switch in a non-operating state, thereby preventing occurrence of a leakage current, which would otherwise arise during the non-operating state.

In one embodiment of the present invention, the control unit is connected to the storage device as a result of closing of the first switch, to thus shift to an operating state by means of power from the storage device, and the control unit connects the storage device to the measurement unit by closing the second switch.

The present invention is also an apparatus for detecting state of a storage device, comprising:

a measurement unit for measuring a voltage of the storage device;

a low-level control unit for controlling operation of the measurement unit;

a first switch for switching a connected state/a disconnected state between the storage device and the low-level control unit;

a second switch that is connected in parallel with the first switch and that switches a connected state/a disconnected state between the storage device and the measurement unit; and a high-level control unit for controlling the first switch, wherein the low-level control unit is connected to the storage device as a result of closing of the first switch, to thus shift to an operating state by means of power from the storage device, and the low-level control unit connects the storage device to the measurement unit by closing the second switch, and the high-level control unit controls the first switch, thereby supplying the low-level control unit with a control signal for controlling operation of the measurement unit. According to the present invention, the storage devices are disconnected from the measurement units in a non-operating state by means of switching the second switches, thereby preventing occurrence of a leakage current, which would otherwise arise in the non-operating state. Moreover, since a control signal for controlling operation of the measurement units can be supplied by means of a simple configuration, and synchronous acquisition of voltages of the storage devices or acquisition of the voltages at arbitrary timings are facilitated.

In one embodiment of the present invention, the low-level control unit is connected to the storage device by closing the second switch, to thus maintain the operating state achieved by means of power from the storage device; and the high-level control unit supplies, as the control signal, a measurement control signal for defining timing at which the measurement unit measures a voltage of the storage device and a synchronous signal for defining output timing of measurement data.

The invention will be more clearly comprehended by reference to the embodiment provided below. However, the embodiment is a mere illustration, and the scope of the invention is not limited to that embodiment.

DETAILED DESCRIPTION

An embodiment of the present invention will be described hereunder by reference to the drawings and by means of taking a battery pack as an example storage device.

Figure 1:
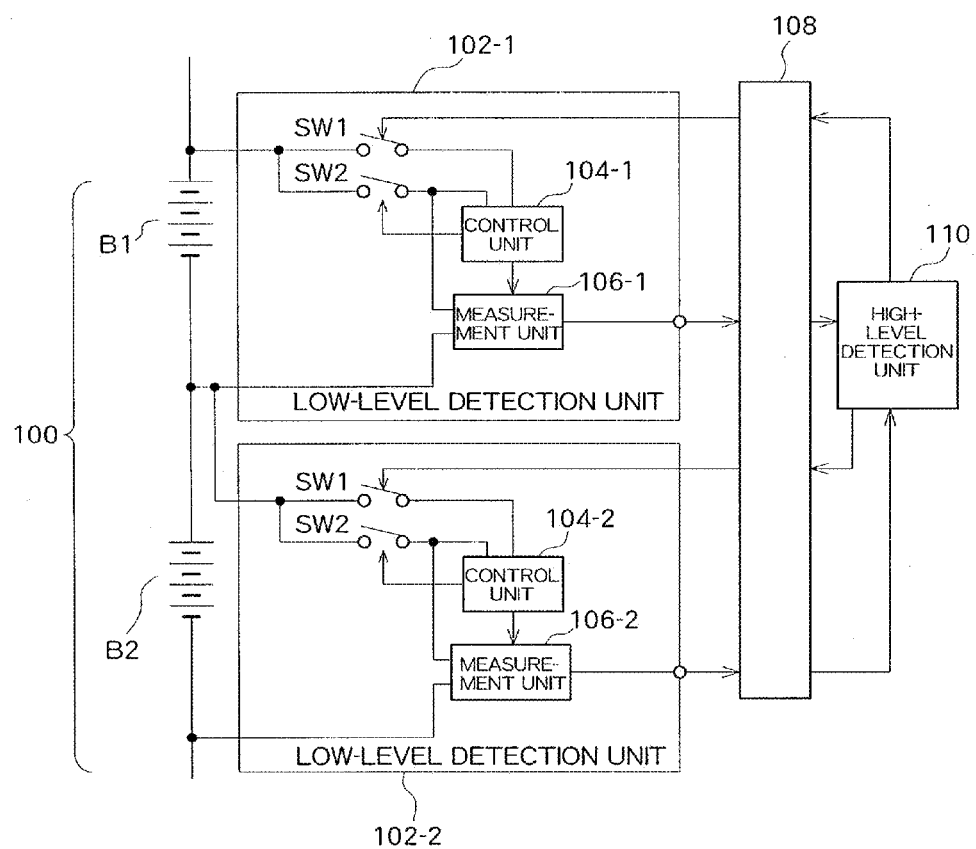
FIG. 1 is a schematic block diagram of a status detection apparatus of an embodiment of the present invention.

FIG. 1 shows a schematic block diagram of a state detection apparatus of an embodiment of the present invention. The state detection apparatus is mounted on, for example, a hybrid electric vehicle, to thus detect a voltage of a battery pack. In FIG. 1, a battery pack 100 serving as a storage device is made up of a plurality of blocks B1 to Bn (only B1 and B2 are shown in the drawing for the sake of convenience), and the respective blocks B1 through Bn are connected in series. Each of the blocks is formed from one cell or a plurality of series-connected cells. Each of the cells corresponds to, for example, a nickel-metalhydride battery or a lithium ion battery.

Low-level detection units 102-1 to 102-n serving as low-level control means are provided for the respective blocks B1 to Bn constituting the battery pack 100 and detect voltages VB1 to VBn of the respective blocks. The low-level detection units 102-1 to 102-n are identical to each other in terms of a configuration. For instance, the low-level detection unit 102-1 is made up of two switches SW1, SW2, a control section 104-1, and a measurement section 106-1.

The two switches SW1 and SW2 are connected in parallel with each other. One terminal of the switch SW1 is connected to a block B1, and the other terminal of the same is connected to the control section 104-1. Activation/deactivation of the switch SW1 is controlled by means of a start signal from a high-level detection unit 110. When the switch SW1 is activated, power for the block B1 is supplied to the control section 104-1, whereupon the control section 104-1 is started. One terminal of the switch SW2 is connected to the block B1, and the other terminal of the same is connected to the control section 104-1 and the measurement section 106-1. Activation/deactivation of the switch SW2 is controlled by a signal from the control section 104-1. When the switch SW2 enters an activated state, power is supplied to the control section 104-1 and the measurement section 106-1, so that the measurement section 106-1 can measure the voltage of the block B1.

The control section 104-1 controls measurement operation of the measurement section 106-1, as well as controlling timing for measuring the voltage of the block B1 by means of controlling activation/deactivation of the switch SW2.

The measurement section 106-1 measures the voltage of the block B1 and supplies a result of measurement to the high-level detection unit 110. The measurement section 106-1 is built from, for example, a combination of an A/D converter, a comparator, and a shift register, a combination of a V/F converter, a pulse counter, and a shift register, or the like.

The high-level detection unit 110 serving as high-level control means is made up of, for example, a microprocessor (MPU). A start signal is supplied to the switches SW1 of the low-level detection units, to thus supply power from the blocks B1, B2, . . . , to the control sections 104-1, 104-2, . . . , of the respective low-level detection units, whereupon the high-level detection unit 110 is started. Moreover, voltages measured by the measurement sections 106-1, 106-2, . . . of the respective low-level detection units are input to the high-level detection unit 110, whereby the state of the battery pack (e.g., a voltage) 100 is detected by means of processing, such as comparison between the measured voltages with a predetermined voltage. The high-level detection unit 110 and the respective low-level detection units are insulated (subjected to high impedance) from each other by means of an insulation section 108 such as a photocoupler.

As mentioned above, there is adopted the configuration for connecting the switches SW1 and SW2 in parallel with each other; supplying power to and starting the control sections 104-1, 104-2, . . . , by controlling the switches SW1 in an activating manner; and controlling activation/deactivation of the switches SW2 separately from the switches SW1, to thus measure voltages of the respective blocks. Thereby, connection between the respective blocks and the measurement sections is easily interrupted in a non-operating period during which voltage measurement processing is not carried out, thereby preventing occurrence of a leakage current, which would otherwise arise during the non-operating period. Moreover, after the control section 104-1 is started by means of activating the switch SW1, the switch SW2 is turned on and latched. Thereby, supply of power by way of the switch SW2 becomes possible, and hence the switch SW1 can be deactivated, to thus serve as a switch for supplying a signal from the high-level detection unit 110 to the control section 104-1. The switches SW1 are for supplying power to the control sections 104-1, 104-2, . . . , when they remain turned on. Each of the switches SW1 can be made up of a low-cost component, such as a high-resistance switching element and a photocoupler. Since a withstand voltage of the switch SW2 is equal to the voltage of each of the blocks, low-resistance switches can be readily selected.

The present embodiment will be described in more detail hereunder.

Figure 2:
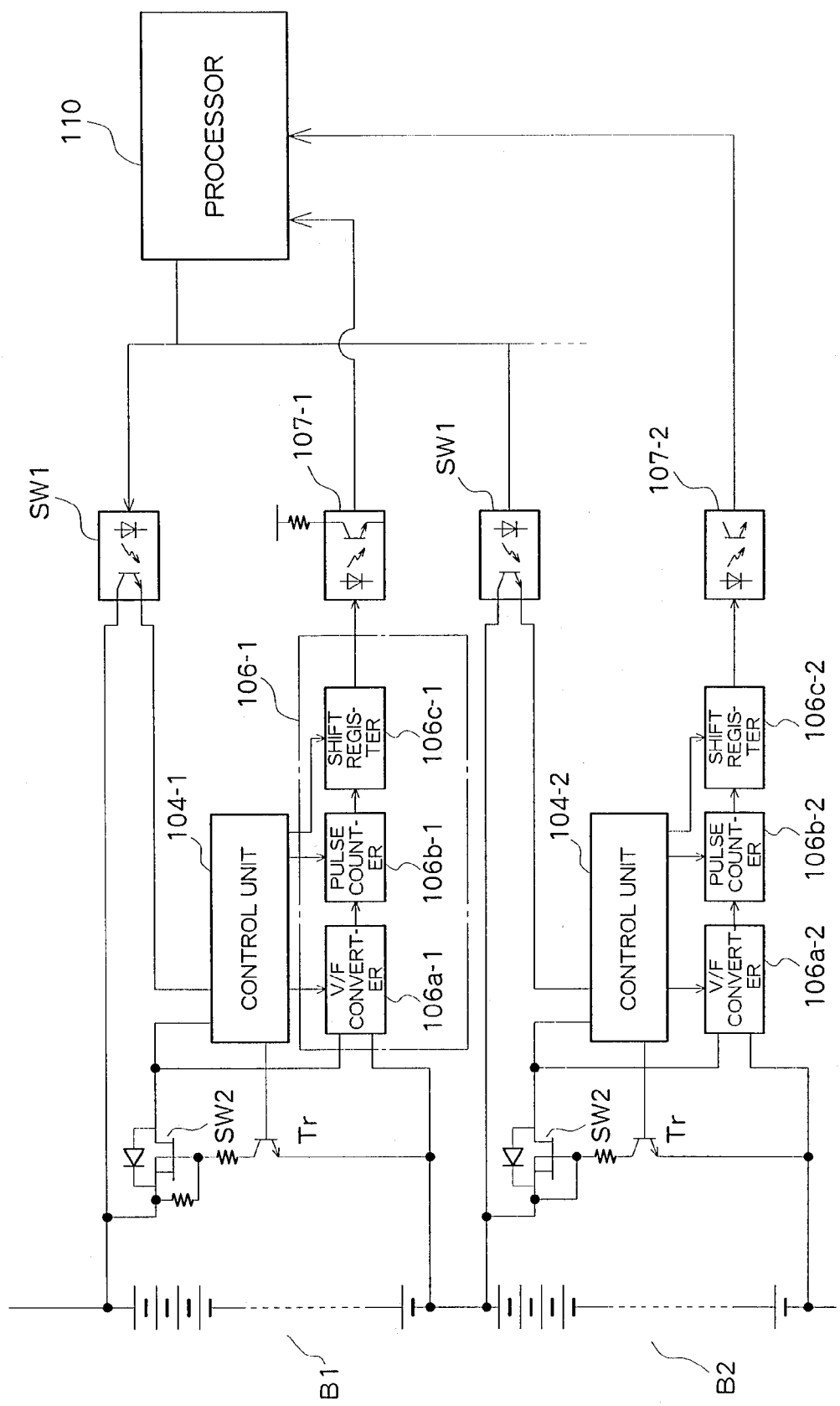
FIG. 2 is a detailed schematic diagram of the status detection apparatus of the embodiment.

FIG. 2 shows a detailed schematic view of the state detection apparatus of the present invention. The low-level detection unit 102-1 has the switches SW1 and SW2, the control section 104-1, and the measurement section 106-1. The other low-level detection units also have a similar configuration. The high-level detection unit 110 is built from a processor.

The switch SW1 is made up of a photocoupler that is a portion of the insulation section 108 shown in FIG. 1. A light-emitting side of the photocoupler is connected to the processor 110, and a light-receiving side of the photocoupler is connected to the block B1 and the control section 104-1.

The switch SW2 is built from a transistor switch such as a p-channel MOSFET. One terminal of the switch SW2 is connected to the block B1, and the other terminal of the same is connected to the control section 104-1 and a V/F converter 106a-1 of the measurement section 106-1. A gate of the transistor switch is also connected to another transistor switch Tr, and activation/deactivation of the transistor switch Tr is controlled by the control section 104-1.

The measurement section 106-1 is built from the V/F converter 106a-1, a pulse counter 106b-1, and a shift register 106c-1. The V/F converter 106a-1 converts a voltage of the block B1 into a frequency, and the pulse counter 106b-1 counts the number of pulses of a block voltage converted into the frequency. The shift register 106c-1 sequentially stores the number of pulses counted by the pulse counter 106b-1; namely, block voltage data, and sequentially outputs the block voltage data to the processor 110 in response to a synchronous signal from the processor 110. The synchronous signal is supplied from the processor 110 to the control section 104-1 and supplied from the control section 104-1 to the shift register 106c-1. As with the start signal, the synchronous signal can be supplied to the control section 104-1 by way of the switch SW1.

When the switch SW1 is turned on by the start signal from the processor 110, the control section 104-1 is started, and an internal oscillator of the control section is started in subsequent operations, thereby performing various processing operations by means of a clock signal of the oscillator. Specifically, the switch SW2 is first turned on by activation of the transistor Tr and latched for a predetermined period of time. It is then determined whether or not a read signal has been supplied from the processor 110. For instance, a determination is made as to whether or not the signal from the processor 110 has changed from a high level to a low level. Power is supplied to the control section 104-1 by way of the switch SW2 as a result of latching of the switch SW2, and the processor 110 can supply a read signal in lieu of power as a result of deactivation of the switch SW1. When the signal from the processor 110 has changed from the high level to the low level, the control section 104-1 determines that the read signal has been supplied and proceeds to predetermined signal processing.

Predetermined signal processing is performed as follows. Namely, a count value of the pulse counter 106b-1 is reset to zero, and counting of pulses is started. After counting of the number of pulses, top ten bits of the pulse counter 106b-1 are copied to the shift register 106c-1. Further, a parity bit is added to the shift register 106c-1, thereby generating data having a total of 11 bits. Next, it is determined whether or not a synchronous signal has been supplied from the processor 110. When the synchronous signal is supplied, the block voltage data stored in the shift register 106c-1 are output at a rising edge of the synchronous signal, and the data in the shift register 106c-1 are sequentially shifted at a rising edge of the same. After output of all of the 11-bit data including the parity bit, the pulse counter 106b-1 is again reset to zero, whereupon counting of pulses is again started. Through repetition of foregoing processing, the block voltage data are sequentially supplied to the processor 110. When the timer counts a predetermined period of time, for example, two seconds simultaneously with activation of the switch SW2, the control section 104-1 controls the switch SW2 in a deactivating manner. Specifically, the switch SW2 is turned on and latched for only two seconds. Along with activation of the switch SW2, the switch SW1 is controlled in a deactivating manner. The control section 104-1 fetches for each sampling clock signal thereof, for example, a signal from the processor 110. When a coincidence has arisen twice at the same level, the signal level is determined. Moreover, the processor 110 fetches at the rising timing of the synchronous signal thereof the block voltage data.

Figure 3:
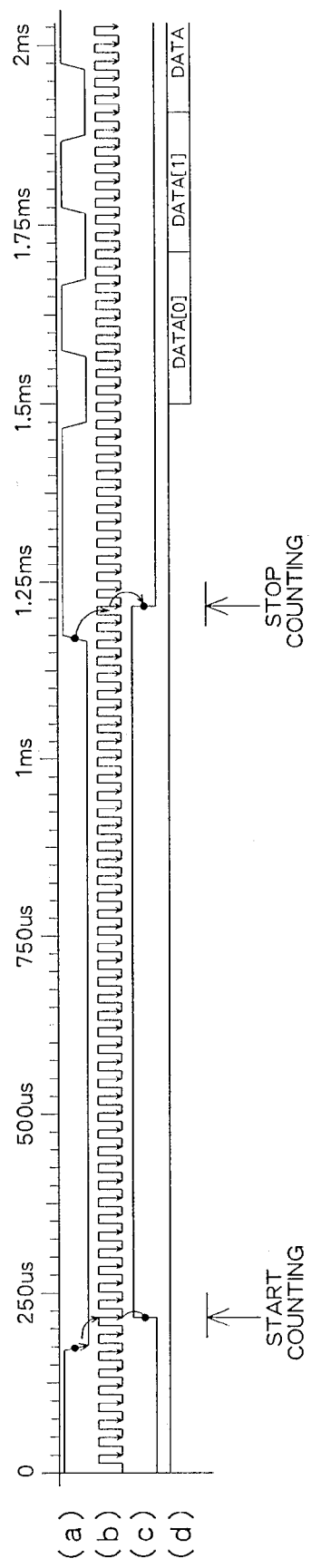
FIG. 3 is timing charts for signals from respective sections shown in FIG. 2.

FIG. 3 shows timing charts for a signal from the processor 110, an internal clock signal of the control section 104-1, a timing signal achieved in a V/F conversion period, and a data output signal. FIG. 3A shows a signal from the processor 110 including a V/F read signal and a synchronous signal. The V/F read signal is a signal whose level comes to a low level, and the synchronous signal is a 5-kHz signal that follows the V/F read signal and assumes a 50% duty ratio. FIG. 3B shows an internal clock signal of the control section 104-1; that is, a 42-kHz signal. The internal clock signal is a sampling signal for fixing a signal level within two periods of the clock signal at the time of determination of the signal from the processor 110. FIG. 3C shows a timing signal achieved in the V/F conversion period, and the signal corresponds to a period for operating the V/F converter 106a-1 and the pulse counter 106b-1. When the signal from the processor 110 is confirmed to have changed from a high level to a low level, the V/F conversion period is started. Moreover, when the signal from the processor 110 has again changed from the low level to the high level, the V/F conversion period is completed. Specifically, operation of the V/F converter 106a-1 and operation of the pulse counter 106b-1 are stopped. FIG. 3D shows a data output signal. When the synchronous signal from the processor 110 is determined, data having a 11-bit length (10-bit voltage data+a parity bit) are sequentially output.

Figure 4:
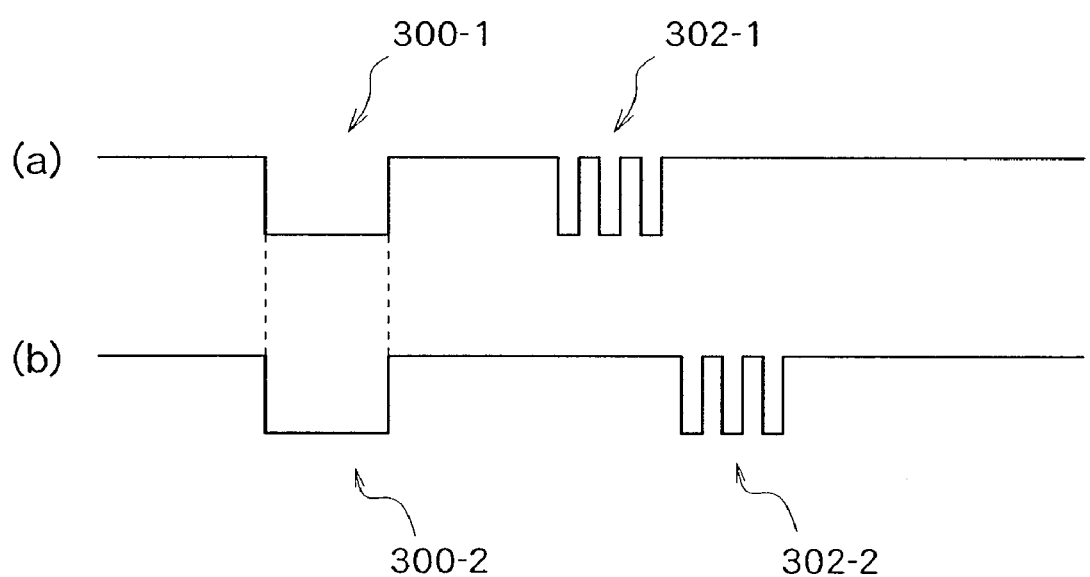
FIG. 4 is timing charts of signals output from a processor.

FIG. 4 shows timing charts for signals supplied from the processor 110 to the control sections 104-1 and 104-2. Signals supplied to the control sections of the respective blocks include V/F read signals 300-1 and 300-2 and subsequent synchronous signals 302-1 and 302-2. The V/F read signals 300-1 and 300-2 supplied to the control sections 104-1 and 104-2 are synchronized in terms of timing, and the synchronous signals 302-1 and 302-2 are out of synchronization in terms of timing. The block voltage data pertaining to the block B1 are output from the shift register 106c-1 at the timing of the synchronous signal 302-1, and block voltage data pertaining to the block B2 are output from the shift register 106c-2 at timing of the synchronous signal 302-2. Synchronization of the block voltages can be achieved by synchronizing the read signals 300-1, 300-2, . . . .

In the present embodiment, a read signal is synchronously output from the processor 110 serving as the high-level detection unit as mentioned above, thereby obviating a necessity for preparing a high-accuracy synchronous clock signal for each low-level detection unit. Simplification of a configuration and cost reduction can be attained. As a matter of course, timings of the read signals 300-1, 300-2, . . . , can also be shifted, and a voltage can be measured at arbitrary timing on a per-block basis. Moreover, the period of a read signal from only a specific block can also be changed to shorten a period of measurement of the specific block, thereby frequently detecting a state of that block.

Although the embodiment of the present invention has been described above, the present invention is not limited to the embodiment and susceptible to various alterations.

Figure 5:
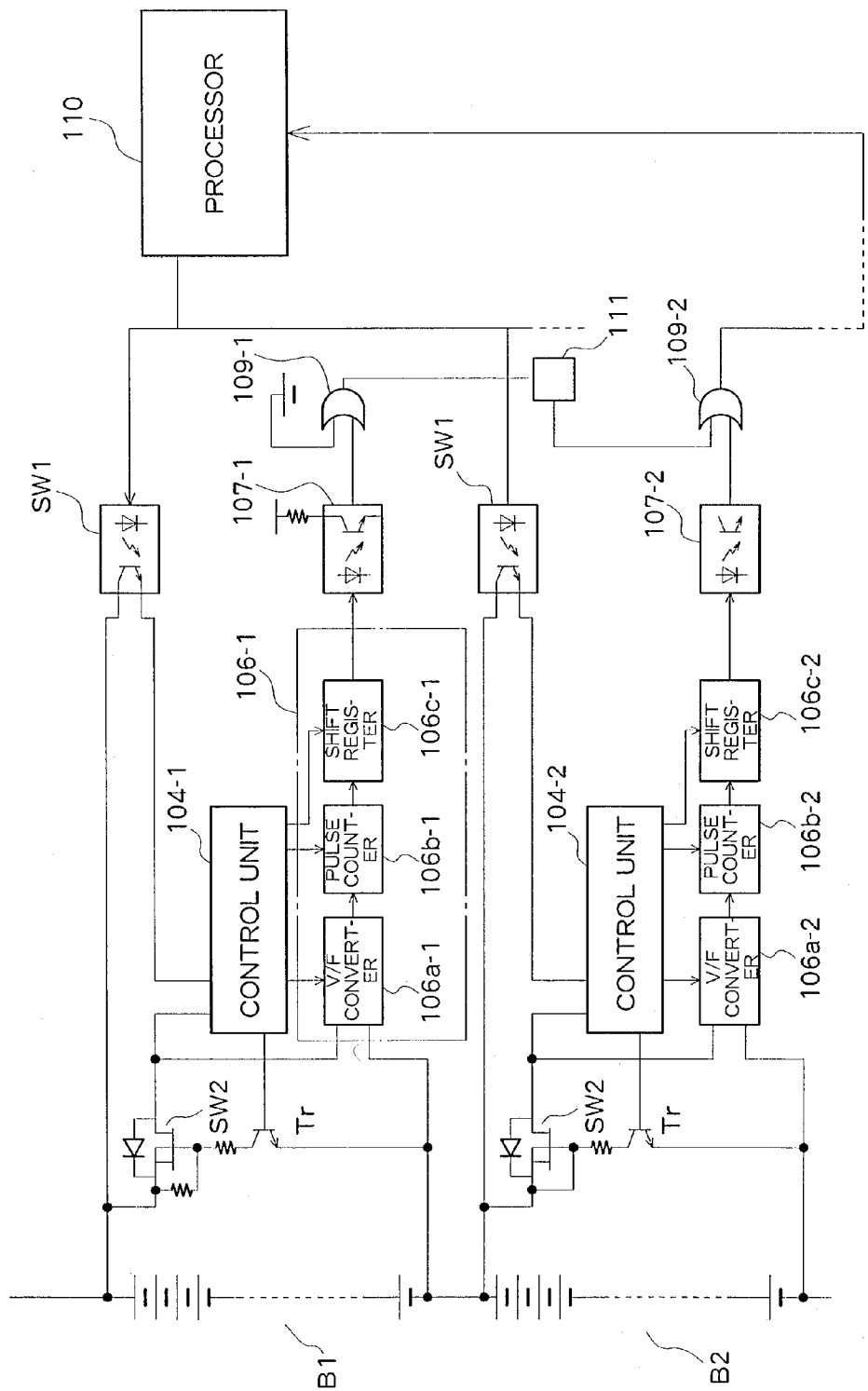
FIG. 5 is a detailed schematic diagram of a status detection apparatus of another embodiment.

For instance, in the present embodiment, the block voltage data are parallelly output to the processor 110 from the low-level detection units 102-1, 102-2, . . . , of the respective blocks, as shown in FIGS. 1 and 2. However, the block voltage data may also be serially output from the low-level detection units 102-1, 102-2, . . . , to the processor 110. FIG. 5 shows a configuration acquired when block voltage data are serially output. OR gates 109-1, 109-2, . . . , are provided at output sides of the shift registers 106c-1, 106c-2, . . . , of the respective low-level detection units 102-1, 102-2, . . . . An output terminal of the OR gate 109-1 is connected to an input terminal of the OR gate 109-2 by way of the voltage level shift circuit 111. All of the OR gates are likewise cascaded and connected to the processor 110.

What is claimed is:
1. An apparatus for detecting state of a storage device, comprising:
 a measurement unit for measuring a voltage of the storage device;
 a low-level control unit for controlling operation of the measurement unit;

a first switch for switching a connected state/a disconnected state between the storage device and the low-level control unit;

a second switch that is connected in parallel with the first switch and that switches a connected state/a disconnected state between the storage device and the measurement unit; and a high-level control unit for controlling the first switch, wherein the low-level control unit is connected to the storage device as a result of closing of the first switch, to thus shift to an operating state by means of power from the storage device, and the low-level control unit connects the storage device to the measurement unit by closing the second switch;

the high-level control unit controls the first switch, thereby supplying the low-level control unit with a control signal for controlling operation of the measurement unit;

the low-level control unit is connected to the storage device by closing the second switch, to thus maintain the operating state achieved by means of power from the storage device;

the high-level control unit supplies, as the control signal, a measurement signal for defining timing at which the measurement unit measures a voltage of the storage device and a synchronous signal for defining output timing of measurement data; and wherein the measurement unit includes:

a voltage/frequency conversion unit for converting a voltage of the storage device into a frequency;

a count unit for counting number of pulses of the frequency; and a register for storing the measurement data acquired by means of counting, wherein the voltage/frequency conversion unit and the count unit operate in response to the measurement signal; and the register sequentially stores and outputs the measurement data in response to the synchronous signal.

* * * * *